United States Patent [19]

Golike et al.

[11] Patent Number: 5,091,229
[45] Date of Patent: Feb. 25, 1992

[54] ELECTRONICS PROTECTIVE PACKAGING FILM

[75] Inventors: Ralph C. Golike, Wilmington, Del.; Hua-Feng Huang, Mendenhall, Pa.; Herminio C. Llevat, Newark, Del.

[73] Assignee: E. I. Du Pont de Nemours and Company, Wilmington, Del.

[21] Appl. No.: 565,771

[22] Filed: Aug. 14, 1990

Related U.S. Application Data

[63] Continuation-in-part of Ser. No. 421,547, Oct. 13, 1989, abandoned.

[51] Int. Cl.$^5$ .................. B65D 27/18; H01B 1/06
[52] U.S. Cl. .................. 428/35.2; 428/403; 428/404; 428/570; 252/518; 206/328; 206/524; 427/215
[58] Field of Search .......... 206/328, 524; 428/922, 428/355, 403, 404, 35.2, 570; 361/212; 427/215; 252/518

[56] References Cited

U.S. PATENT DOCUMENTS

| 4,211,822 | 7/1980 | Kurfman et al. | 428/412 |
| 4,373,013 | 2/1983 | Yoshizumi | 428/570 |
| 4,452,830 | 1/1984 | Yoshizumi | 427/215 |
| 4,699,830 | 10/1987 | White | 428/35 |

FOREIGN PATENT DOCUMENTS

| 62-18564 | 1/1987 | Japan . |
| 63-20342 | 1/1988 | Japan . |

OTHER PUBLICATIONS

Journal of Material Science, 21 (1986) 2731-2734.

*Primary Examiner*—James J. Seidleck
*Assistant Examiner*—Charles R. Nold
*Attorney, Agent, or Firm*—Charles E. Krukiel

[57] ABSTRACT

Packages prepared from a flexible static charge-dissipating structure comprising a substrate film, a coating layer of heat sealable thermoplastic matrix containing micron sized particles of a silica containing material surface coated with antimony-containing tin oxide crystallites, and optionally a thin layer of metal, provide excellent static charge protection to sensitive electronic components.

31 Claims, 2 Drawing Sheets

ELECTRONICS PROTECTIVE PACKAGING FILM

CROSS-REFERENCE TO A RELATED APPLICATION

This is a continuation-in-part of U.S. application Ser. No. 07/421,547 filed Oct. 13, 1989, abandoned.

BACKGROUND OF THE INVENTION

This invention relates to novel composites useful for machine packaging electrostatic sensitive electronic components or assemblies to protect them from damages due to electrostatic discharge, electrostatic field force, radio-frequency interference, moisture, and corrosive gases.

Functional failures or manufacturability impairments of modern electronics components or assemblies are often traceable to damage due to electrostatic discharge, electrostatic field force, radio frequency interference, moisture, corrosive gases, and machine oil they may experience during shipping and storage. The problem has increased in severity in recent years and will continue to worsen because of the increased miniaturization and speed of devices and systems, like VLSI (Very Large Scale Integration) chips, the impact of new automated manufacturing processes such as high heat and chemical, e.g., oil, solvents, etc., exposure in a surface mount assembly line, and the increased demands for higher reliability.

Packaging materials have been developed for electrostatic discharge protection. U.S. Pat. No. 3,572,499, for example, discloses a composite laminated material in sheet form comprising a layer of thin sheet metal, typically aluminum foil, a layer of protective material secured to one face of the metal layer (to form the outside of a package or container) and an exposed layer of an electrically conductive, synthetic organic polymeric plastic material (to form the interior surface of the package or container). The protective material is preferably paper or fabric, and the conductive plastic material is preferably polyethylene filled with a non-metallic filler such as carbon.

U.S. Pat. Nos. 4,156,751 and 4,154,344 disclose a flexible sheet material for forming an envelope used to enclose and protect electronic components from electrostatic charges. The envelope includes a polymeric sheet, an antistatic material disposed at an inner surface, and a conductive layer disposed on the outer surface. The inner, antistatic layer acts as a humectant surface to collect water to reduce friction and minimize static charges. The external (metallized) layer has light transmissivity of at least 25 % (optical density of at the most 0.6).

U.S. Pat. No. 4,424,900 discloses an anti-static package composed of a multi-ply flexible film. The inner ply is an antistatic material and the outer ply is an electrically insulating material. A conductive metallic ply is sandwiched between the inner and outer ply. The antistatic ply is an antistatic polyolefin material; the metallic ply is a thin sputtered layer of, e.g., stainless steel, preferably having a light transmission in excess of 70% (optical density of at most 0.15).

U.S. Pat. No. 4,699,830 discloses a laminated sheet material which can be used to form packages for electrically sensitive components. The laminated sheet includes an antistatic layer, a first and a second conductive metal layer, and a carrier film layer. The antistatic layer can be a polyolefin-based material. The metal layers are vacuum deposited layers, preferably thin enough to permit light transmission in combination of 15-70% (o.d. 0.15-0.82).

U.S patent application Ser. No. 07/386,765, filed Aug. 2, 1989, describes an electroconductive powder composition comprising a amorphous silica particles which are uniquely associated with a two-dimensional network of antimony-containing tin oxide crystallites. This powder can be incorporated as a component within a polymeric carrier matrix which can take the form of a paint film, fiber, or a variety of shaped articles.

Many of the prior art packages or films employ antistatic agents which are moisture dependent or which consist of carbon particles, but which can also contaminate sensitive electronic components. Furthermore, such packages do not always provide the most satisfactory barrier properties against moisture or other contaminants. Many such packages, in addition, can be bulky, stiff, or too thick to be readily used in automated packaging machinery. The present invention provides new packaging materials for protective packaging of electrostatic, radio frequency interference, and moisture sensitive electronic components or assemblies, readily usable in automated form, fill, and seal packaging machines, thus overcoming many of the deficiencies of prior art materials.

SUMMARY OF THE INVENTION

The present invention provides a flexible static charge-dissipating structure comprising:

(a) a substrate film;

(b) a coating of at least one layer selected from a heat sealable thermoplastic matrix or latex on at least one surface of said substrate film; and (c) particles of a silica-containing material, surface coated with a two-dimensional network of antimony-containing tin oxide crystallites in which the antimony content ranges from about 1 to about 30 percent by weight of the tin oxide, said particles being dispersed in at least one layer of said matrix and being present in sufficient quantity to provide a surface resistivity of less than about $10^{12}$ ohms per square.

The flexible structure of the invention exhibits a high heat seal strength of up to at least about 626 grams/cm and oil resistance which can meet or exceed military specifications.

The invention also provides a similar structure further comprising a thin, flexible layer of metal of sufficient thickness to provide electromagnetic interference shielding in the frequency range of 0.1 to 10.0 gigahertz of at least about 25 db, as well as improved barrier properties.

DETAILED DESCRIPTION OF THE INVENTION

The substrate material of this invention is a polymeric film which has sufficient puncture resistance to endure the rigors of modern shipping and handling. Yet for many applications the film should not be so thick or stiff that it cannot be readily formed into a flexible package or bag using conventional packaging equipment. In addition, the film will preferably have sufficient dimensional stability to endure a vacuum metallization process (commonly involving temperatures of about 100° C.) without shrinking or otherwise distorting.

Suitable substrate films include those made of polyesters such as polyethylene terephthalate (PET), polymethylpentene, polyarylate, polypropylene, nylon, polycarbonate, cellophane, polyetherimide, polyimide, and the like. A preferred substrate is biaxially oriented polyethylene terephthalate. Such a film is preferably at least about 10 micrometers but less than about 100 micrometers thick. Particularly suitable are such films having a thickness of from about 20 to about 25 micrometers. For improved heat sealability and oil resistance the preferred film substrate is oriented linear low-density polyethylene, such as, for example, Sclair TM -SC, available from Du Pont (Canada).

At least one surface of the substrate film is coated with at least one layer of a heat sealable thermoplastic material or latex. This material serves to provide heat sealability if desired for, e.g., package formation and also serves as a matrix to carry selected electroconductive particles, described below. Suitable heat sealable thermoplastic materials are known in the art; particularly suitable resins include polyesters selected from the group consisting of copolymers of ethylene glycol, terephthalic acid, and azelaic acid; copolymers of ethylene glycol, terephthalic acid, and isophthalic acid; and mixtures of such copolymers. The heat sealable thermoplastic material can be a composition of such copolymers with minor amounts of conventional additives including block or slip agents such as stearic acid, stearamide, or erucamide and fillers such as magnesium silicate.

At least one layer of the heat sealable thermoplastic material serves as a matrix to carry selected electroconductive particles. Such particles should be contained in a surface or near-surface layer of material so that they can serve to impart static dissipative properties to the film structure. The electroconductive particles preferred for the present invention and their preparation are described in U.S. patent application Ser. No. 07/386,765, the disclosure of which is incorporated herein by reference. The electroconductive particles are micron-sized particles of a silica-containing material, surface coated with a two-dimensional network of antimony-containing tin oxide crystallites in which the antimony content ranges from about 1 to about 30 percent by weight. By "micron-sized" it is meant that the average diameter or greatest dimension of the particles is on the order of about 0.2 to about 20 microns, preferably about 1 to about 10 microns.

The silica-containing material is, in general, a material having an extensive co-valent network involving $SiO_4$ tetrahedra, thus offering the potential for surface hydroxyl formation. The preferred material is amorphous silica. The silica-containing material can be in practically any shape but is preferably in the form of platelets or hollow shells. Platelets of silica-containing material can be formed by coating the material on flake-shaped particles such as mica. Hollow shells can be formed by coating a finely divided solid core material with active silica and then removing the core material without unduly disturbing the silica coating. In either case, the silica coating or shell should be relatively thin, less than about 250 nm and preferably in the range of about 5 to about 20 nm. Alternatively, the silica coating can be formed on permanent core particles of, e.g., $TiO_2$ or clay.

The silica-containing material is coated with a substantially two-dimensional network of densely packed antimony-containing tin oxide crystallites. The layer of such crystallites is typically about 5 to 20 nm thick, but covers the surface of a particle with major dimensions that are typically ten to ten thousand times as large as the thickness of the tin oxide layer, and thus is substantially two dimensional. The tin oxide crystallites contain about 1 to 30 percent by weight antimony, preferably about 10 percent by weight.

The electroconductive particles (ECP) are dispersed in the matrix polymer at such a concentration that a certain amount of electrical conductivity is imparted to the matrix polymer and thus to the film structure. In order to obtain a coated film with a surface resistivity of about $10^{12}$ ohms/square or less, the concentration of ECP in the matrix should be at least about 25%. For many applications, such as packaging films suitable for protecting electronic components from static discharge, a surface resistivity of at least $10^5$ ohms/square but less than $10^{12}$ ohms/square is desired; in such cases the concentration of ECP should be about 25 to about 55% by weight, or more preferably about 30 to about 40%.

Of course, the resistivity of the film surface will depend in part on the thickness of the matrix layer containing the ECP. Very thin layers will exhibit increased resistivity, and vice versa. While surface coating of about 1 to about 25 $g/m^2$ (in terms of combined matrix and ECP) may be suitable, preferably the coating will be present at about 3 to about 12-13 $g/m^2$. The physical thickness of such coatings is typically several micrometers.

Such coatings are typically applied by a solution coating process, wherein the matrix polymer is dissolved in a suitable solvent and the ECP is dispersed therein. A coating of solution is applied by spraying, dipping, or coating with a doctor knife, followed by removal of the solvent, e.g., by a hot air or radiant dryer.

A preferred embodiment of the present invention comprises a film structure which additionally comprises a thin, flexible layer of metal, preferably located as an interior layer of a multilayer structure. This additional layer provides electromagnetic interference (EMI) shielding. EMI shielding is often desired in packaging for sensitive electronic components, and can be provided by a vacuum deposited layer of metal, deposited on the substrate film by well-known techniques. Alternatively, EMI can be provided with a heat sealable/metal foil structure instead of a metallized film, such as, for example, with a Surlyn ®/foil substrate. In either case, the metal is not particularly limited, although metals which are relatively unreactive to air and moisture are preferred. Most specially preferred is aluminum. A vacuum deposited layer of aluminum of sufficient thickness to exhibit surface resistivity of 40 ohms/square or less, and preferably 10 ohms/square or less, provides useful shielding properties. These levels correspond to optical densities of about 0.5 and 0.9, respectively. The upper limit in terms of amount of metallization depends on economic factors and the necessity of maintaining a flexible film structure for many packaging applications.

EMI shielding can be evaluated in terms of reduction of intensity of an electromagnetic signal of 1 to 10 GHz upon passing through a test film. For many demanding applications, a reduction of at least 25 decibels (db) is desired.

An additional benefit derived from the use of a thin layer of metal in the composition is a marked improvement in barrier properties to such substances as water, oxygen, or corrosive materials. Particularly demanding applications may require water vapor transmission rates of at most 1 g/m$^2$-day or better. These stringent barrier requirements can be met or exceeded by laminating two layers of metallized together so that the layers of metal are joined face to face. Such an arrangement minimizes the problems of penetration of contaminants through pinholes that may be present in a single metallized layer.

Figure 1:
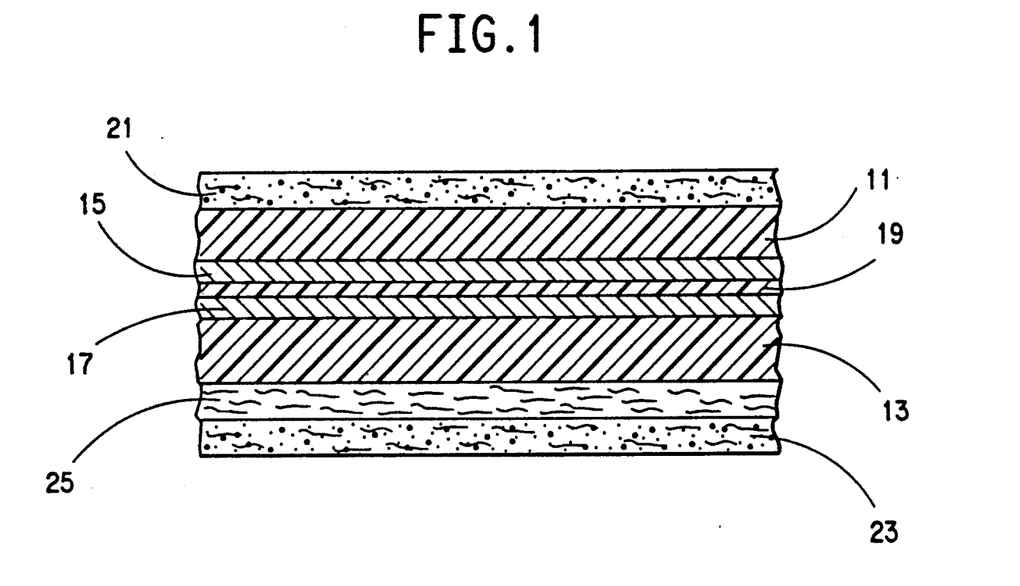
FIG. 1 illustrates one preferred embodiment of the structure of the present invention.

A highly preferred structure, therefore, is a face-to-face laminate of two metallized substrate films, with coatings of heat sealable thermoplastic material or latex containing ECP on at least one, and preferably both, of the outer surfaces. Such a structure is shown diagrammatically in FIG. 1. Substrate films 11 and 13 each support a layer of vacuum metallized aluminum, 15 and 17. The films are joined using a conventional adhesive layer 19. The two outermost layers, 21 and 23, are heat sealable matrix resin compositions in which ECP is dispersed. Layer 25 is an optional underlying layer of heat sealable resin matrix compositions substantially free of ECP; a corresponding layer (not shown) may optionally also be present underlying outer layer 21. The additional heat sealable layer, when present, improves the strength of heat seals when the film structure is formed into a package.

The preferred structures of the present invention are strong and flexible, have excellent EMI shielding and barrier properties. They also have excellent static dissipative properties, as measured by the rate of decay of a static charge (normally less than 0.5 seconds, in comparison with a desired goal of 2 seconds). This static dissipative property is virtually insensitive to moisture, in contrast to the behavior of many conventional systems which are much less effective under dry conditions. Moisture insensitivity is important for packaging of electronic components which may themselves require both protection from static discharge and a dry storage environment.

Figure 2:
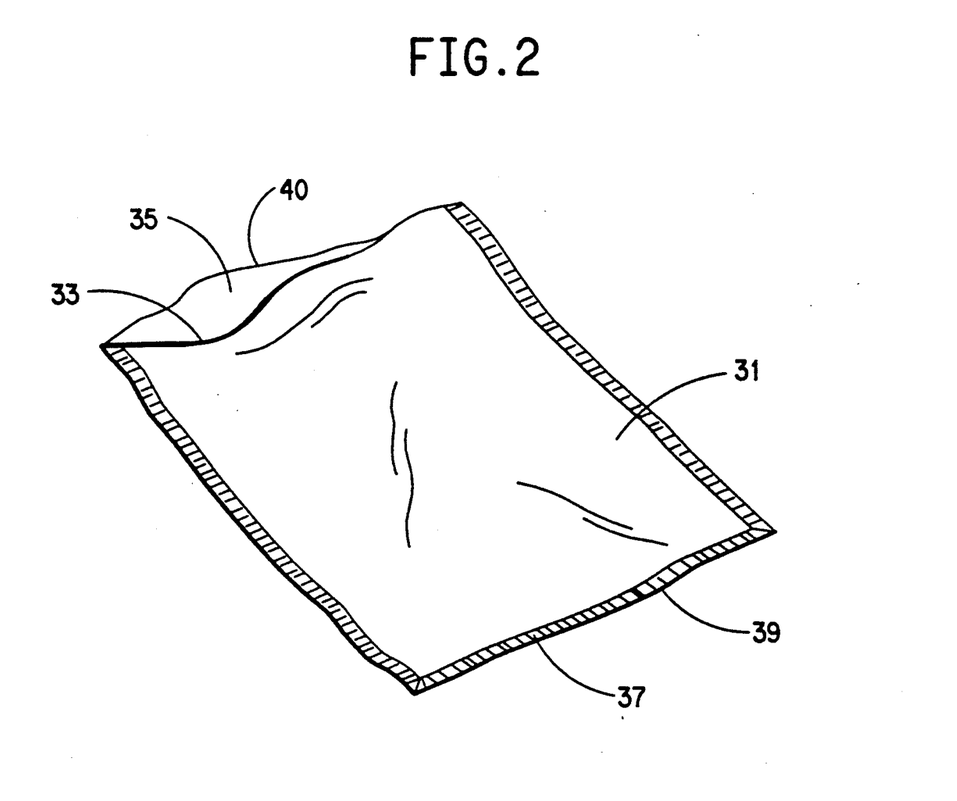
FIG. 2 shows a package or pouch prepared from the structure of the present invention.
Figure 3:
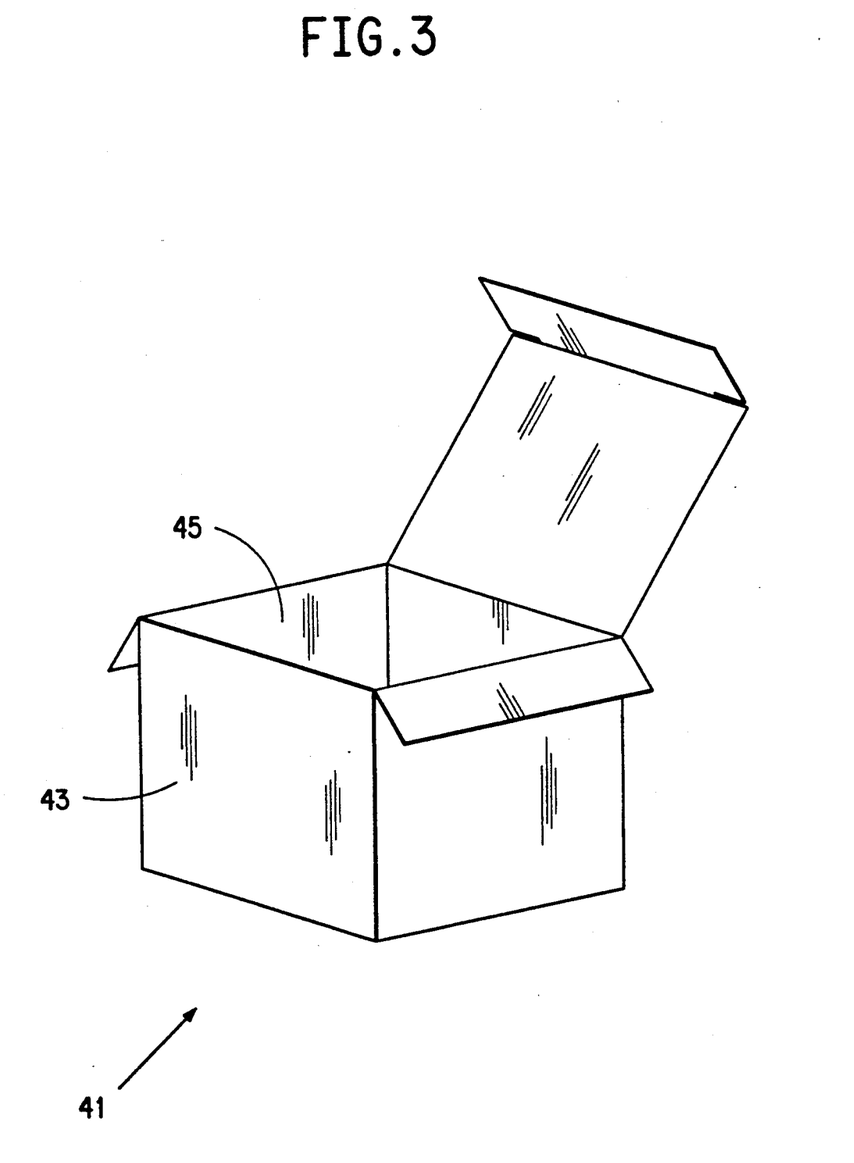
FIG. 3 shows an alternative package of the present invention.

The invention further comprises protective packages prepared from films and laminated structures of the present invention. A simple package or pouch is shown in FIG. 2. The pouch or bag 31 is formed from a front leaf 33 and a back leaf 35 joined along the edges by a heat seal 37 or other means. The front and back leaves can be made from different pieces of coated structure, or they can result from folding a single sheet over on itself along a crease 39 (in which case a seal at that location is not needed). When an item is inserted in the pouch, the open end 40 can be similarly sealed. While a simple pouch-like structure as illustrated is preferred for simplicity, other packages can equally well be formed, such as gussetted bags, and so on. In particular, FIG. 3 shows a box 41 made of cardboard or a similar structural material 43. The inner surfaces 45 of the cardboard is lined or laminated with the film or laminated structures of the present invention.

Packages such as those illustrated provide protection to packaged items from static discharge, even when the interior of the package is very dry. Furthermore, the presence of one or more layers of vacuum deposited metal serves to keep ambient humidity from penetrating into a sealed package, as well as providing EMI shielding. Such packages can be used for shipping and storing electronic components such as semiconductor wafers, surface mount and through-hole components, integrated circuit chips, subassemblies, finished assemblies, populated and unpopulated printed circuit boards, and larger electronic components such as personal computer keyboards. Other uses include packaging of medical and surgical products and general use for packaging in explosive environments.

Measurement Procedures

The following measurement procedures are used for the Examples:

| MEASUREMENT | PROCEDURE |
|---|---|
| Surface Resistivity | ASTM D-257 |
| Puncture Resistance | Federal Test Method 101-2065 |
| EMI-Shielding and | Military specification |
| Oil Resistance | MIL-B-81705C, January 25, 1989, obtainable from Naval Air Engineering Center, Lakehurst, NJ 08733-5100, unless otherwise indicated. |
| Decay Time | Federal Test Method 101-4046 |
| Water Vapor Transmission Rate (WVTR) | ASTM F-1249 (38.7° C., 90% RH, using a "Permatran-W" from Modern Control, Inc.) |
| Optical Density | AIMCAL TP-101 |
| Light Transmission | ASTM D1746-40 |

EXAMPLES 1-9 AND COMPARATIVE EXAMPLES C1-C4

The following Examples and Comparative Examples illustrate the effective amounts of electroconductive particles in thermoplastic matrix coating which provide static dissipative film surfaces at both dry and ambient humidity conditions.

The electroconductive particles are antimony-containing tin oxide-coated fine silica hollow shells as disclosed in U.S. patent application Ser. No. 07/385,765.

In a 189 L glass lined kettle, agitated with an anchor type 0.46 m impeller turning at 90 rpm, 76 L of deionized water are added and the pH is adjusted to 10.0 using about 10 mL of 30% aqueous sodium hydroxide. 1.4 kg of PQ Kasil #6 potassium silicate solution (26.5% SiO$_2$, 12.5% K$_2$O) is added to the slurry, followed by 12.2 kg of Pfizer Albacar H.O. Dry, calcium carbonate powder, which has a surface area of 11.4 m$^2$/g, and the kettle temperature is brought to 90° C. over a 30 minute period by running steam through a steam jacket. Next, 14 kg of the potassium silicate solution is combined with 23 kg of deionized water and added to the slurry over 4 hours. During this period, the pH of the slurry is kept above 9.0 by feeding 33 kg of 4 wt% hydrochloric acid at a steady 100 mL/hr rate.

After the silicate feed is complete, the slurry is cured for 30 minutes at 90° C., then the pH is adjusted to 8.0 by adding 3.6 kg of 30% hydrochloric acid solution. The 8.0 pH slurry is cooled to 60° C., and filtered to dewater.

The filter cake is redispersed in 27 kg of deionized water and charged to the same 189 L kettle as used above (still at 90 RPM agitator speed), and heated to 90° C. Next, 25 kg of 30 wt. % hydrochloric acid is added to bring pH down to 2. Solutions of 20 kg of tin tetrachloride solution (50%) and 7 kg water, and 1.13 kg antimony trichloride and 2.6 kg of 37 wt% hydrochloric acid are premixed, combined, and fed to the kettle over 2 hours. The pH is kept constant at 2.0 by adding 30 wt% aqueous sodium hydroxide at about 120 mL/min. When the tin/antimony addition is complete, the slurry is cured for 30 minutes at 90 C and 2 pH, cooled to 60° C., filtered, and washed to 200 micro-Mhos with water to remove soluble salts. The product cake is then dried at 150° C. for 20 hours and calcined for 2 hours at 750 C.

The calcined product is coated with 1 weight percent triethanol amine and micronized at a rate of 1000 g/min.

When examined under the electron microscope, the micronized powder from above is found to consist of hollow shells of silica and fragments of shells of silica with fine crystallites of antimony-doped tin oxide forming a two-dimensional network on the surface of the silica. The silica shells are approximately 20 nm thick, and the doped tin oxide coating is approximately 10 nm thick.

The product surface area analysis by nitrogen adsorption is 58.7 m²/g. The median particle size is 2.3 micrometers, with about 68% of the particles being between 1.3 and 3.9 micrometers in diameter.

A heat-sealable polyester resin composition (referred to as "OL") is used as a matrix material to contain the electroconductive particles and serve as a coating. The OL is prepared mixing 15.8 weight parts of the condensation product of 1.0 mol ethylene glycol with 0.53 mol terephthalic acid and 0.47 mol azelaic acid with 0.5 weight parts erucamide and 58 weight parts of tetrahydrofuran (used as a solvent, not a part of the resin composition itself) in a heated glass reactor vessel equipped with paddle stirrer. After dissolution of the solids at 55° C., 0.5 weight parts of magnesium silicate are blended in.

Coating baths containing 12.5%, 25%, 40%, and 55% ECP-shell based on solids are prepared by blending 2.4, 5.6, 11.2, and 20.5 weight parts of ECP-shell into the OL/solvent mixture prepared above. These dispersions are coated on 12 micrometer thick biaxially oriented polyethylene terephthalate film and dried.

The surface resistivity and decay time of films coated with these compositions are measured at relative humidities of 50 and 5%. The results are shown in Table I.

TABLE I

| Sample | ECP-shell Conc., (%) | Coating Weight g/m² | % RH | Decay Time (sec.) | Log (R)[a] |
|---|---|---|---|---|---|
| C1 | 12.5 | 5.7 | 50 | ND[b] | 15.0 |
|    |      |     | 5  | ND    | 14.6 |
| C2 | 12.5 | 11.8 | 50 | ND | 14.5 |
|    |      |     | 5  | ND | 14.5 |
| C3 | 12.5 | 18.1 | 50 | ND | 14.8 |
|    |      |     | 5  | ND | 15.4 |
| C4 | 25 | 3.1 | 50 | ND | 14.0 |
|    |    |     | 5  | ND | 14.3 |
| 1 | 25 | 5.7 | 50 | ND | 9.6 |
|   |    |     | 5  | ND | 15.2 |
| 2 | 25 | 11.6 | 50 | 0.01 | 6.2 |
|   |    |      | 5  | 0.01 | 6.9 |
| 3 | 40 | 3.1 | 50 | 0.01 | 7.5 |
|   |    |     | 5  | 0.01 | 7.6 |
| 4 | 40 | 7.0 | 50 | 0.01 | 4.8 |
|   |    |     | 5  | 0.01 | <5 |
| 5 | 40 | 17.4 | 50 | 0.01 | <5 |
|   |    |      | 5  | 0.01 | 4.8 |
| 6 | 55 | 6.9 | 50 | 0.01 | 4.8 |
|   |    |     | 5  | 0.01 | 5.2 |
| 7 | 55 | 9.7 | 50 | 0.01 | 5.0 |
|   |    |     | 5  | 0.01 | <5 |
| 8 | 55 | 16.5 | 50 | 0.01 | <5 |
|   |    |      | 5  | 0.01 | <5 |

TABLE I-continued

| Sample | ECP-shell Conc., (%) | Coating Weight g/m² | % RH | Decay Time (sec.) | Log (R)[a] |
|---|---|---|---|---|---|
| 9 | 55 | 22.8 | 50 | 0.01 | <5 |
|   |    |      | 5  | 0.01 | <5 |

[a]Log (surface resistance in ohms/square)
[b]ND indicates no measurable decay.

The result show that a 25% concentration of ECP-shell in 12 g/m² coating and 40% concentration in 4 g/m² gives the best results.

EXAMPLES 10-17 AND COMPARATIVE EXAMPLES C5-C8

The following Examples and Comparative Examples illustrate the effective amounts of a different type of electroconductive particles in thermoplastic matrix coating which provide static dissipative film surface at both dry and ambient humidity conditions.

The electroconductive particles are electroconductive particles coated on mica, ("ECP-mica"), as disclosed in U.S. patent application Ser. No. 07/386,765.

Twenty-eight kg of wet-ground muscovite mica with a surface area of 8.7 m²/g is dispersed in 61 L of water, and the pH is adjusted to 10.0 with 40 mL of 30% aqueous sodium hydroxide. The coating tank is a 189 L kettle with an anchor type impeller (0.46 m diameter) spinning at 90 RPM. Over a 5 minute period, 7.2 kg of PQ Kasil #6 potassium silicate solution (26.5 wt.% $SiO_2$, 12.5 wt.% $K_2O$) is pumped into the kettle, and the mix is heated to 90° C. over a 20 minute period.

Hydrochloric acid (17 kg of 4 wt.% HCl) is added at a rate of 4.5 kg per hour to the slurry to precipitate the silica onto the mica surface. At the end of the addition, the pH is 7.00. The slurry is allowed to cure at 90° C. for ¼ hour. After the cure, the slurry is pumped to a plate and frame filter, filtered, and washed to 200 micro-Mhos with deionized water.

One half of the cake is reslurried in 45 kg of deionized water and charged to the kettle. Calcium chloride solution (25 kg lbs at 28 wt.%) is added to the bath over a 15 minute period. Tin tetrachloride (29.3 kg 50 wt % tin tetrachloride solution and 9.8 kg water) and antimony trichloride (1.6 kg of antimony trichloride in 3.8 kg 37% HCl) solutions are mixed together and added to the slurry over a 2.5 hour period. During this time, the pH of the slurry is kept at 2 by continuously feeding 30% sodium hydroxide (about 41 kg).

The product is cured for 30 minutes at 90° C. and 2 pH, cooled to 60° C., filtered and washed with water to 200 micro Mhos to remove soluble salts, and dried at 150° C. for 20 hours. The dried product is calcined in air at 750° C. for 2 hours. The mica based electroconductive powder has a surface area of 32 m²/g, a silica layer approximately 20 nm thick and a coating of doped tin oxide about 10 nm thick.

The heat-sealable polyester resin composition (OL) coating is prepared in the same manner as described in Example 1.

Coating baths of 12.5%, 25%, 40%, and 55% ECP-mica (based on solids) are prepared as above. These coating dispersions are coated on 12 micrometer thick biaxially oriented polyethylene terephthalate film and dried.

The results of tests performed on coated films are reported in Table II.

TABLE II

| Sample | ECP-mica Conc., (%) | Coating Weight g/m² | % RH | Decay Time (sec.) | Log (R) |
|---|---|---|---|---|---|
| C5 | 12.5 | 6.1 | 50 | ND | 14.9 |
|  |  |  | 5 | ND | 14.4 |
| C6 | 12.5 | 9.4 | 50 | ND | 14.5 |
|  |  |  | 5 | ND | 14.9 |
| C7 | 12.5 | 17.5 | 50 | ND | 14.9 |
|  |  |  | 5 | ND | >15 |
| C8 | 25 | 3.9 | 50 | ND | 15.5 |
|  |  |  | 5 | ND | 13.8 |
| 10 | 25 | 7.7 | 50 | ND | 13.5 |
|  |  |  | 5 | ND | 3.9 |
| 11 | 25 | 11.3 | 50 | 0.01 | 6.7 |
|  |  |  | 5 | 0.01 | 7.2 |
| 12 | 40 | 3.8 | 50 | 0.01 | 6.2 |
|  |  |  | 5 | 0.01 | 7.4 |
| 13 | 40 | 7.7 | 50 | 0.01 | <5 |
|  |  |  | 5 | 0.01 | 5.2 |
| 14 | 40 | 17.8 | 50 | 0.01 | <5 |
|  |  |  | 5 | 0.01 | <5 |
| 15 | 55 | 9.4 | 50 | 0.01 | <5 |
|  |  |  | 5 | 0.01 | <5 |
| 16 | 55 | 13.0 | 50 | 0.01 | <5 |
|  |  |  | 5 | 0.01 | <5 |
| 17 | 55 | 20.9 | 50 | 0.01 | <5 |
|  |  |  | 5 | 0.01 | <5 |

The result show that a 25% concentration of ECP-mica in 11 g/m² coating and 40% concentration in 4 g/m² give the best results.

EXAMPLES 18–25 AND COMPARATIVE EXAMPLES C9–C13

Several experiments are performed to determine the amount of aluminum metallization needed to provide sufficient electromagnetic interference (EMI) shielding.

A biaxially oriented polyester film of 12 micrometer thickness is vacuum vapor-metallized with aluminum to an optical density of 0.18 to 3.55.

The results of the EMI-shielding measurements are reported in Table III. Results reported at 2.45 GHz are made by measuring microwave energy transmitted through a coaxial test cell, move SET-19, manufactured by Elgal Industries, Ltd., Israel. The signal is generated by a Hewlett Packard HP8620C sweep oscillator. A Hewlett Packard HP8755C scalar network analyzer is used to obtain the scattering matrix parameters of the sample under test.

TABLE III[a]

| Ex. | Aluminum Optical Density | Metallization Surface Resistivity | EMI-Shielding (db) 2.45 GHz | 1–10 GHz |
|---|---|---|---|---|
| C9 | 0.18 | 333 | 3 | — |
| C10 | 0.32 | 33 | 9.7 | 12 |
| C11 | 0.48 | 40 | 17 | — |
| C12 | 0.65 | 22 | 18 | — |
| C13 | 0.84 | 12 | 24 | — |
| 18 | 0.94 | 7 | 27 | — |
| 19 | 1.04 | 5 | 29 | 22 |
| 20 | 1.40 | 4 | 33 | — |
| 21 | 1.62 | 2.4 | 36 | — |
| 22 | 2.05 | 1.7 | 37 | — |
| 23 | 2.20 | 1.4 | 40 | — |
| 24 | 3.05 | 0.9 | 44 | — |
| 25 | 3.55 | 0.7 | 50 | 40 |

[a]Resistivity in ohms/square. A hyphen (—) indicates shielding measurement not made.

From the results in Table III it is seen that an aluminum metallization of thickness equivalent to an optical density of 0.9 or higher (or surface resistivity of 10 ohm/square or less) will give EMI shielding of >25 db over the frequency band of 1.0 to 10.0 GHz.

EXAMPLES 26 AND 27

Experiments are performed to determine the thickness of the biaxially stretched polyester film needed to achieve a puncture-resistance strength of greater than 44.5 N (10.0 pounds), thus suitable for particularly demanding applications.

Five samples each of 23 micrometer thick and 12 micrometer thick aluminum-metallized biaxially stretched polyester films are tested for puncture resistance strength using a 13 mm (½ inch) diameter probe. The results are as follows:

| Example | Thickness (micrometers) | Puncture-Resistance (N) Average of Five | Std Dev |
|---|---|---|---|
| 26 | 12 | 15.6 | 0.73 |
| 27 | 23 | 27.1 | 0.58 |

It appears that two layers of 23 micrometer biaxially oriented polyester films will provide puncture resistance strength in excess of 44.5 N (10 pounds).

EXAMPLE 28

A laminate is prepared having a structure ECP-shell-OL/23PET-Al/Adh./Al-23PET/ECP-shell-OL where ECP-shell-OL is a suspension of electroconductive particles in an OL matrix, as described above, 23PET is biaxially oriented PET film, 23 micrometers thick, Al is a layer of vacuum deposited aluminum, optical density specification 2.0, and Adh. is a thermal cure adhesive (Adcote TM 506-40, catalyst 9L10, from Morton Thiokol Company). The layers of aluminized PET are first laminated together, face to face, using the adhesive, and oven-cured at 80° C. To complete curing of the adhesive, the laminate is stored in room temperature for three days.

The resultant laminate is coated on both outer surfaces with 4 g/m² total coating weight (each side) of ECP in OL (40 % of dried coating weight is electroconductive particles, "ECP-shell", and 60 % of dried coating weight is heat-sealable polyester resin, OL). The coating is prepared as described above.

The resulting structure is tested with results indicated below:

| Ex. | RH % | Decay Time (sec) | Log (R) | Shielding Static (volts) | 1–10 GHz (db) | WVTR (g/m²-day) |
|---|---|---|---|---|---|---|
| 28 | 50 | 0.01 | 7.0–7.5 | 10–30 | >25 | 0.41 (73 hr) |
|  | 5 | 0.01 | 7.1 |  |  | 0.45 (91 hr) |
|  |  |  |  |  |  | 0.44 (115 hr) |

The results show that the laminate exhibits excellent electrical, mechanical, and barrier properties.

EXAMPLES 29–36

The effect of lamination and extent of metallization is examined by vacuum depositing a layer of aluminum, with optical density as indicated in Table IV, onto a sheet of 12 micrometer PET film. Water vapor transmission rate is measured for each such film. In addition, laminated metal-to-metal samples of the films are prepared, using Adcote TM adhesive. The resulting laminates are measured and the results reported in Table IV. Unlaminated and corresponding laminated samples are grouped together in pairs, the laminated sample indicated by the letter "L."

TABLE IV

| Ex. | Measured Optical Density | WVTR (g/m²-day) |
|---|---|---|
| 29 | 0.17 | 41.3 (19 hr); 40.1 (44 hr) |
| 30 (L) | 0.26 | 21.4 (20 hr); 21.3 (46 hr) |
| 31 | 0.49 | 42.5 (22 hr); 41.4 (48 hr) |
| 32 (L) | 1.04 | 6.38 (24 hr); 6.44 (43 hr) |
| 33 | 0.70 | 36.6 (23 hr); 36.1 (46 hr) |
| 34 (L) | 1.67 | 1.88 (24 hr); 1.80 (47 hr) |
| 35 | 2.0 | 5.39 (26 hr); 5.54 (48 hr) |
| 36 (L) | 5.8 | 0.60 (28 hr); 0.04 (50 hr) |

EXAMPLE 37-39

The following examples illustrate the effect of varying the thickness of the film structure and addition of an additional underlying layer of substantially unfilled OL on the heat sealing ability of film structures of the present invention.

A 40 weight % (dry solids basis) ECP-shell dispersion in standard OL heat-sealable polyester resin bath is prepared as described in Example 3. Example 37 is prepared by laminating two 23 micrometer layers of PET, aluminized to a nominal optical density of 2.0, using Adcote ™ adhesive Both outer surfaces of the laminate are coated with about 4 g/m² of the above dispersion and dried. Two sheets of the laminate are sealed together as described below.

Example 38 is prepared by coating a single sheet of 23 micrometer PET with first a coating of 3.9 g/m² OL heat sealable polyester without ECP-shell, drying, and thereafter coating both sides of the structure with 8.7 g/m² (total for both sides) of the above dispersion but without erucamide. Two sheets of this material are sealed together as described below.

Example 39 is prepared as Example 38, except that erucamide was present in the final coating. The first coating of OL is 3.9 g/m²; the outer coating together.

The sheets in these Examples are sealed together face to face using a "Sentinel" bar sealer with a 2.54 cm wide bar, from Packaging Industries Co. Sealing conditions (time, temperature, and pressure) are indicated in Table V. The seal strength is also indicated. It is apparent from the results that Example 37, which uses a thicker, laminated structure and does not have the additional layer of OL heat sealable polyester, will require more intense sealing conditions in order to form a satisfactory seal.

(It is separately observed that sealing a single sheet similar to that of Example 39 to a single sheet of PET coated with a layer of ECP in OL (without an underlying layer of unfilled OL polyester) gives intermediate heat seal strength.)

TABLE V

| | | Sealing Conditions | | | Seal Strength (g/cm) | |
|---|---|---|---|---|---|---|
| Ex. | Run | Pressure (kPa) | Temp. (°C.) | Time (sec) | Average | Std. Dev. |
| 37 | a | 414 | 93 | 0.25 | 0 | — |
| | b | 140 | 93 | 0.25 | 0 | — |
| | c | 414 | 60 | 0.25 | 0 | — |
| | d | 140 | 60 | 0.25 | 0 | — |
| | e | 414 | 121 | 0.25 | 0 | — |
| | f | 140 | 121 | 0.25 | 0 | — |
| 38 | a | 140 | 121 | 0.25 | 338 | 29 |

TABLE V-continued

| | | Sealing Conditions | | | Seal Strength (g/cm) | |
|---|---|---|---|---|---|---|
| Ex. | Run | Pressure (kPa) | Temp. (°C.) | Time (sec) | Average | Std. Dev. |
| | b | 140 | 121 | 0.5 | 341 | 7 |
| | c | 414 | 121 | 0.25 | 356 | 21 |
| | d | 414 | 121 | 0.5 | 366 | 24 |
| | e | 140 | 149 | 0.25 | 351 | 11 |
| | f | 140 | 149 | 0.5 | 368 | 20 |
| | g | 414 | 149 | 0.25 | 346 | 20 |
| | h | 414 | 149 | 0.5 | 370 | 11 |
| | i | 140 | 204 | 0.25 | 338 | 49 |
| | j | 140 | 204 | 0.5 | 331 | 50 |
| | k | 414 | 204 | 0.25 | 376 | 24 |
| | l | 414 | 204 | 0.5 | 399 | 24 |
| 39 | a | 140 | 121 | 0.25 | 316 | 33 |
| | b | 140 | 121 | 0.5 | 391 | 12 |
| | c | 414 | 121 | 0.25 | 402 | 19 |
| | d | 414 | 121 | 0.5 | 402 | 13 |
| | e | 140 | 149 | 0.25 | 360 | 5 |
| | f | 140 | 149 | 0.5 | 330 | 11 |
| | g | 414 | 149 | 0.25 | 316 | 21 |
| | h | 414 | 149 | 0.5 | 323 | 1 |
| | i | 140 | 204 | 0.25 | 338 | 15 |
| | j | 140 | 204 | 0.5 | 322 | 8 |
| | k | 414 | 204 | 0.25 | 291 | 26 |
| | l | 414 | 204 | 0.5 | 332 | 16 |

EXAMPLES 40-42

The coated film structures of Example 37-39 are sealed together with an impulse seal instrument which uses an electrically heated "Nichrome" wire to obtain an approximately 3 mm seal. Example 40 is prepared using the materials of Example 37, 41 uses the materials of 38, and 42 uses the materials of 39. The results in Table VI show that pulse times of 0.5 seconds are adequate to obtain a seal strength of about 400 g/cm for Examples 41 and 41. Example 40, using thicker materials and lacking the additional layer of OL polyester, requires about 0.7 seconds.

TABLE V

| | | Seal Time | Seal Strength (g/cm) | | |
|---|---|---|---|---|---|
| Ex. | Run | (sec) | Average | Std. Dev. | Type of failure |
| 40 | a | 0.5 | 273 | 84 | Peel |
| | b | 0.6 | 173 | 65 | Peel |
| | c | 0.7 | 394 | 34 | Peel Tear |
| | d | 0.8 | 395 | 193 | Tear @ interface |
| 41 | a | 0.3 | 311 | 56 | Peel |
| | b | 0.5 | 392 | 19 | Tear @ interface |
| 42 | a | 0.3 | 312 | 21 | Peel |
| | b | 0.5 | 454 | 27 | Tear @ interface |

EXAMPLES 43-46

The puncture strength of laminates of two layers of PET, is measured. Films of PET having thickness 12 or 23 micrometers, as indicated in Table VII, are vacuum aluminized to a nominal optical density of 2.0. The sheets are laminated together, metal side to metal side, using a layer of Adcote ™ adhesive. The outer surfaces of the laminates are coated with shell ECP - OL composition approximately as described in Example 3. The structures so prepared are tested as in Examples 26 and 27. The results in Table VII indicate that laminates provides excellent puncture resistance.

TABLE VII

| Example | Thicknesses (micrometers) | Puncture Resistance (N) |
| --- | --- | --- |
| 43 | 23/23 | 240, 260 |
| 44 | 12/12 | 102, 113 |
| 45 | 12/23 | 215, 209 |
| 46 | 23/23[a] | 245, 262 |

[a] prepared using corona treated PET film and a somewhat thicker layer of shell-ECP-OL than Example 43.

EXAMPLES 47—HIGH HEAT SEAL STRENGTH AND OIL RESISTANCE 38.7 grams of antimony-containing tin oxide-coated fine hollow silica shells from Examples 1-9 was mixed with 100 grams of latex solution (Goodrich Hycar Acrylic 26373, 50% solids). The resulting dispersion was further diluted with 150 grams of de-ionized water.

The diluted dispersion was then coated onto a prefabricated substrate laminate having a structure Sclair TM - SC/Adcote333/49LBMylar TM /OL/48LBMylar TM /OL/Foil where Sclair TM -SC is 51 micrometers thick oriented linear-low-density-polyethylene film available from Du Pont (Canada); Adcote333 is a thermal cure adhesive from Morton Thiokol Company; 40LBMylar TM is 12 micrometer thick biaxially oriented PET film available from E. I. du Pont de Nemours and Company; OL is a heat-sealable polyester resin composition of Examples 1-9; and OL/48LBMylar TM /OL is available as 50 OL Mylar TM from E. I. du Pont de Nemours and Company. The Foil used is 50.8 micrometer thick )-dry aluminum foil from Reynolds Metal Company. The substrate laminate of this Example exhibits improved heat seal strength and oil resistance. The coating application is by hand drawdown with a #10 Meyor-wireround-rod metering. The physical characteristics of the dried coated surface of the resulting laminate are summarized below.

| Ex. | Dried Coating Weight (g/sq-m) | Substrate Laminate | | | | |
| --- | --- | --- | --- | --- | --- | --- |
| 47 | 12.4 | Sclair TM -SC/Adcote333/48LBMylar TM /OL-Pet-OL/Foil | | | | |

| | Surface | Heat Seal Strength | | Seal Strength (3 Trials) | | | |
| --- | --- | --- | --- | --- | --- | --- | --- |
| Ex. | Resistivity @ 12% RH Log (R) | Sealing Temp. (°F.) | Dwell Time (sec) | #1 (g/cm) | #2 (g/cm) | #3 (g/cm) | Oil Delamination Test |
| 47 | 5.61 | 425 | 5 | 945 | 886 | 984 | Pass |

We claim:

1. A flexible static charge-dissipating structure comprising:
    (a) a substrate film;
    (a) a coating of at least one layer selected from a heat sealable thermoplastic matrix or latex on at least one surface of said substrate film; and
    (a) an electroconductive pigment comprising shaped particles of a silica-containing material which is amorphous silica or a silica-containing material having an extensive co-valent network involving $SiO_4$ tetrahedra, and which particles are surface coated with a two-dimensional network of antimony-containing tin oxide crystallites in weight of the tin oxide, said particles being dispersed in at least one layer of said matrix or said latex and being present in sufficient quantity whereby the particles interconnect and form an electroconductive network within the matrix or latex and provide a surface resistivity of less than about $10^{12}$ ohms per square.

2. The structure of claim 1 further comprising a thin, flexible layer of metal of sufficient thickness to provide electromagnetic interference shielding in the frequency range of 0.1 to 10.0 gigahertz of at least about 17 db.

3. The structure of claim 1 further comprising a thin, flexible layer of metal of sufficient thickness to provide electromagnetic interference shielding in the frequency range of 0.1 to 10.0 gigahertz of at least about 25 db.

4. The structure of claim 1 further comprising a thin, flexible layer of metal of sufficient thickness to provide a water vapor transmission rate of at most about 1 g/m$^2$-day 5. The structure of claim 2 wherein the substrate film is selected from the group consisting of films of polyester, polymethylpentene, polyarylate, polypropylene, nylon, polycarbonate, cellophane, polyetherimide, and polyimide.

6. The structure of claim 5 wherein the substrate film is polyethylene terephthalate.

7. The structure of claim 6 wherein the thickness of the polyethylene terephthalate film is about 10 to about 50 micrometers.

8. The structure of claim 6 wherein the thickness of the polyethylene terephthalate film is about 20 to about 25 micrometers.

9. The structure of claim 1 wherein the coating is a heat sealable thermoplastic matrix which is applied from solution.

10. The structure of claim 2 wherein the coating is a heat sealable thermoplastic matrix which is a copolymer of ethylene glycol with terephthalic acid and azelaic acid.

11. The structure of claim 2 wherein the particles of silica-containing material are hollow shells of amorphous silica.

12. The structure of claim 2 wherein the particles of silica-containing material are flakes of mica coated with amorphous silica.

13. The structure of claim 10 Wherein the concentration of coated particles in the matrix is about 25 to about 55 percent by weight.

14. The structure of claim 13 wherein the concentration of the coated particles in the matrix is about 30 to about 40 percent by weight.

15. The structure of claim 2 wherein the coating is a thermoplastic matrix and weight of the particles and matrix coating is about 1 to about 25 g/m$^2$.

16. The structure of claim 15 wherein the weight of the particles and matrix coating is about 3 to about 13 g/m$^2$.

17. The structure of claim 1 wherein the coating is a layer of heat sealable thermoplastic matrix in which the particles are embedded, and the matrix overlies a layer of heat sealable thermoplastic matrix which is substantially free of said particles.

18. The structure of claim 2 wherein the metal is vacuum deposited.

19. The structure of claim 18 wherein the metal is aluminum.

20. The structure of claim 19 wherein the amount of aluminum is sufficient to provide a surface resistivity of at most about 10 ohms per square.

21. A flexible static charge-dissipating laminated structure comprising two layers of the structure of claim 2 laminated together, metallized surface-to-metallized surface.

22. The laminated structure of claim 21 wherein the substrate is polyethylene terephthalate film about 10 to about 50 micrometers thick, the coating is a matrix which is a copolymer of ethylene glycol with terephthalic acid and azelaic acid, the particles are hollow spheres or sphere fragments of amorphous silica, present in the matrix at about 25 to about 40 weight percent, and the metal is vacuum deposited aluminum having a surface resistivity of at most about 10 ohms per square.

23. The laminated structure of claim 21 wherein the substrate is polyethylene terephthalate film about 10 to about 50 micrometers thick, the matrix is a copolymer of ethylene glycol with terephthalic acid and azelaic acid, the particles are flakes of mica coated with amorphous silica, present in the matrix at about 25 to about 40 weight percent, and the metal is vacuum deposited aluminum having a surface resistivity of at most about 10 ohms per square.

24. A flexible, static charge-dissipating package suitable for containing a static-sensitive article, comprising at least one leaf formed from the structure of claim 1, configured to form a cavity of suitable size and shape for enclosing the article and held in said configuration by means of at least one seal.

25. A flexible, static charge-dissipating package suitable for containing a static-sensitive article, comprising at least one leaf formed from the structure of claim 2, configured to form a cavity of suitable size and shape for enclosing the article and held in said configuration by means of at least one seal.

26. A flexible, static charge-dissipating package suitable for containing a static-sensitive article, comprising at least one leaf formed from the structure of claim 17, configured to form a cavity of suitable size and shape for enclosing the article and held in said configuration by means of at least one seal.

27. A flexible, static charge-dissipating package suitable for containing a static-sensitive article, comprising at least one leaf formed from the structure of claim 21, configured to form a cavity of suitable size and shape for enclosing the article and held in said configuration by means of at least one seal.

28. A flexible, static charge-dissipating package suitable for containing a static-sensitive article, comprising at least one leaf formed from the structure of claim 22, configured to form a cavity of suitable size and shape for enclosing the article and held in said configuration by means of at least one seal.

29. A flexible, static charge-dissipating package suitable for containing a static-sensitive article, comprising at least one leaf formed from the structure of claim 23, configured to form a cavity of suitable size and shape for enclosing the article and held in said configuration by means of at least one seal.

30. A static charge-dissipating package suitable for containing a static-sensitive article, comprising at least one layer formed from the structure of claim 1 and a substantially rigid substrate to which said layer is attached, said substrate and said layer being configured to form a cavity of suitable size and shape for enclosing the article.

31. A static charge-dissipating package suitable for containing a static-sensitive article, comprising at least one layer formed from the structure of claim 2 and a substantially rigid substrate to which said layer is attached, said substrate and said layer being configured to form a cavity of suitable size and shape for enclosing the article.

* * * * *